(12) United States Patent
Harder et al.

(10) Patent No.: US 11,047,034 B1
(45) Date of Patent: Jun. 29, 2021

(54) CONDUCTIVE HIGH TOUGHNESS OXIDES DEPOSITED BY PLASMA SPRAY—PHYSICAL VAPOR DEPOSITION (PS-PVD)

(71) Applicant: United States of Americas as represented by the Administrator of NASA, Washington, DC (US)

(72) Inventors: Bryan J. Harder, Bay Village, OH (US); Michael P. Schmitt, Cleveland, OH (US); Brian S. Good, Cleveland, OH (US)

(73) Assignee: United States of America as Represented by the Administrator of National Aeronautics and Space Administration, Washington, DC (US)

( * ) Notice: Subject to any disclaimer, the term of this patent is extended or adjusted under 35 U.S.C. 154(b) by 237 days.

(21) Appl. No.: 15/883,551

(22) Filed: Jan. 30, 2018

Related U.S. Application Data

(60) Provisional application No. 62/451,804, filed on Jan. 30, 2017.

(51) Int. Cl.
*C23C 4/11* (2016.01)
*C23C 4/134* (2016.01)

(52) U.S. Cl.
CPC ............... *C23C 4/11* (2016.01); *C23C 4/134* (2016.01)

(58) Field of Classification Search
CPC .................................. C23C 4/11; C23C 4/134
USPC ....................................................... 428/702
See application file for complete search history.

(56) References Cited

U.S. PATENT DOCUMENTS

| | | |
|---|---|---|
| 8,491,996 B2 | 7/2013 | Schier |
| 8,986,792 B2 | 3/2015 | Hospach et al. |
| 2013/0344319 A1 | 12/2013 | Zhu et al. |
| 2014/0131091 A1* | 5/2014 | Smith ................ C03C 17/23 174/565 |

(Continued)

OTHER PUBLICATIONS

Chadli et al., Kinetics of oxidation of Fe—Cr—Al alloy Characterization . . . , 2009, Physics Procedia, URL: <http://www.sciencedirect.com/science/article/pii/S1875389209001400/pdf?md5=b5cedcd91397bcb0d8b051ea4f9d2145&pid=1 -s2.0-S1875389209001400-main.pdf&_valck=1>, pp. 1015-1020 (Year: 2009).*

(Continued)

*Primary Examiner* — Humera N. Sheikh
*Assistant Examiner* — Katherine A Christy
(74) *Attorney, Agent, or Firm* — Robert H. Earp, III; Mark Wolfgang; Helen M. Galus

(57) ABSTRACT

Oxide coatings deposited by plasma spray-physical vapor deposition (PS-PVD) can be processed to be mechanically tough (erosion resistant) and electrically conductive at room temperature. The electrically conductive phase contained within the oxide ($MO_2$) coatings is a metastable suboxide (MO) that has not been formed in significant volume under any other known methods. Content of the electrically conductive phase can be varied in addition to the microstructure, which can be columnar, planar, or a combination of the two depending on the processing conditions. Upon exposing the material to moderate temperatures (>300° C.), the metastable phase is further oxidized (to $MO_2$), and the material becomes insulating, but retains its high toughness and microstructure.

6 Claims, 4 Drawing Sheets

(56) References Cited

U.S. PATENT DOCUMENTS

2014/0272169 A1    9/2014  Lee
2015/0079370 A1    3/2015  Sun et al.
2017/0218501 A1*   8/2017  Lee .................. C04B 41/52

OTHER PUBLICATIONS

Porier et al. "Deposition of zirconium monoxide glomeruli by laser ablation," Oct. 1998, URL: <https://www.researchgate.net/profile/Thierry_Poirier/publication/257469251_Deposition_of_zirconium_monoxide_glomeruli_by_laser_ablation/links/02e7e52f92aa6bd5f8000000.pdf>, pp. 1-10 (Year: 1998).*

Sampath et al., "Processing science of advanced thermal-barrier systems," Oct. 2012, URL:<http://zj5lm7ny2a.scholar.serialssolutions.com/?sid=google&auinit=S&aulast=Sampath&atitle=Processing+science+of+advanced+ thermal-barrier+systems&id=doi:10.1557/mrs.2012.233&title=MRS+bulletin&volume=37&issu> (Year: 2012).*

Mercer et al., "On a Ferroelastic Mechanism Governing the Toughness of Metastable Tetragonal-Prime (t') Yttria-Stabilized Zirconia ," May 8, 2007, Royal Society, URL: <https://www.jstor.org/stable/pdf/20209189.pdf?refreqid=excelsior%3A024e95377be5242f5a3d2d41d7cd1875>, pp. 1393-1408 (Year: 2007).*

Swab, "Role of Oxide Additives in Stabilizing Zirconia for Coating Applications," Sep. 2001, URL: <https://www.researchgate.net/publication/235117738_Role_of_Oxide_Additives_in_Stabilizing_Zirconia_for_Coating_Applications/link/55d90c0508aeb38e8a87bfc2/download>, pp. 1-34 (Year: 2001).*

Zhang et al., "Gas-deposition mechanisms of 7YSZ coating based on plasma spray-physical vapor," Nov. 11, 2015, URL: < https://reader.elsevier.com/reader/sd/pii/S0955221915302028?token=8820798C358F9DFC69E5E04A27DB8FFB6AE444E5CB129723D8C48FBF9D19D66F4448B65612>, pp. 697-703 (Year: 2015).*

* cited by examiner

CONDUCTIVE HIGH TOUGHNESS OXIDES DEPOSITED BY PLASMA SPRAY—PHYSICAL VAPOR DEPOSITION (PS-PVD)

CROSS-REFERENCE TO RELATED APPLICATIONS

This application claims the benefit of U.S. Provisional Patent Application Ser. No. 62/451,804 entitled "Conductive High Toughness Oxides Deposited By Plasma Spray-Physical Vapor Deposition (PS-PVD)" filed on Jan. 30, 2017, the entirety of which is incorporated by reference herein.

ORIGIN OF THE INVENTION

The invention described herein was made by employees of the United States Government and may be manufactured and used only by or for the Government for Government purposes without the payment of any royalties thereon or therefore.

TECHNICAL FIELD

The innovation relates to oxide coatings and methods for making oxide coatings having superior mechanical strength and electrical conductivity at room temperature.

BACKGROUND

Oxide coatings have been used in thermal and environmental barrier layers for coatings for hot section turbine applications. Such coatings have been deposited by various methods, including via plasma spray-physical vapor deposition (PS-PVD). Current oxide coatings do not include formation of metastable phases (e.g., ZrO).

SUMMARY

The following presents a simplified summary of the innovation in order to provide a basic understanding of some aspects of the innovation. This summary is not an extensive overview of the innovation. It is not intended to identify key/critical elements of the innovation or to delineate the scope of the innovation. Its sole purpose is to present some concepts of the innovation in a simplified form as a prelude to the more detailed description that is presented later.

The innovation is an oxide coating and a method of making an oxide coating that includes deposition under a set of conditions using the processing technique of Plasma Spray-Physical Vapor Deposition (PS-PVD). The coating that is being deposited has unique qualities that cannot be achieved using other method, including metastable phases (e.g., ZrO, HfO).

To the accomplishment of the foregoing and related ends, certain illustrative aspects of the innovation are described herein in connection with the following description and the annexed drawings. These aspects are indicative, however, of but a few of the various ways in which the principles of the innovation can be employed and the subject innovation is intended to include all such aspects and their equivalents. Other advantages and novel features of the innovation will become apparent from the following detailed description of the innovation when considered in conjunction with the drawings.

DETAILED DESCRIPTION

Figure 1:
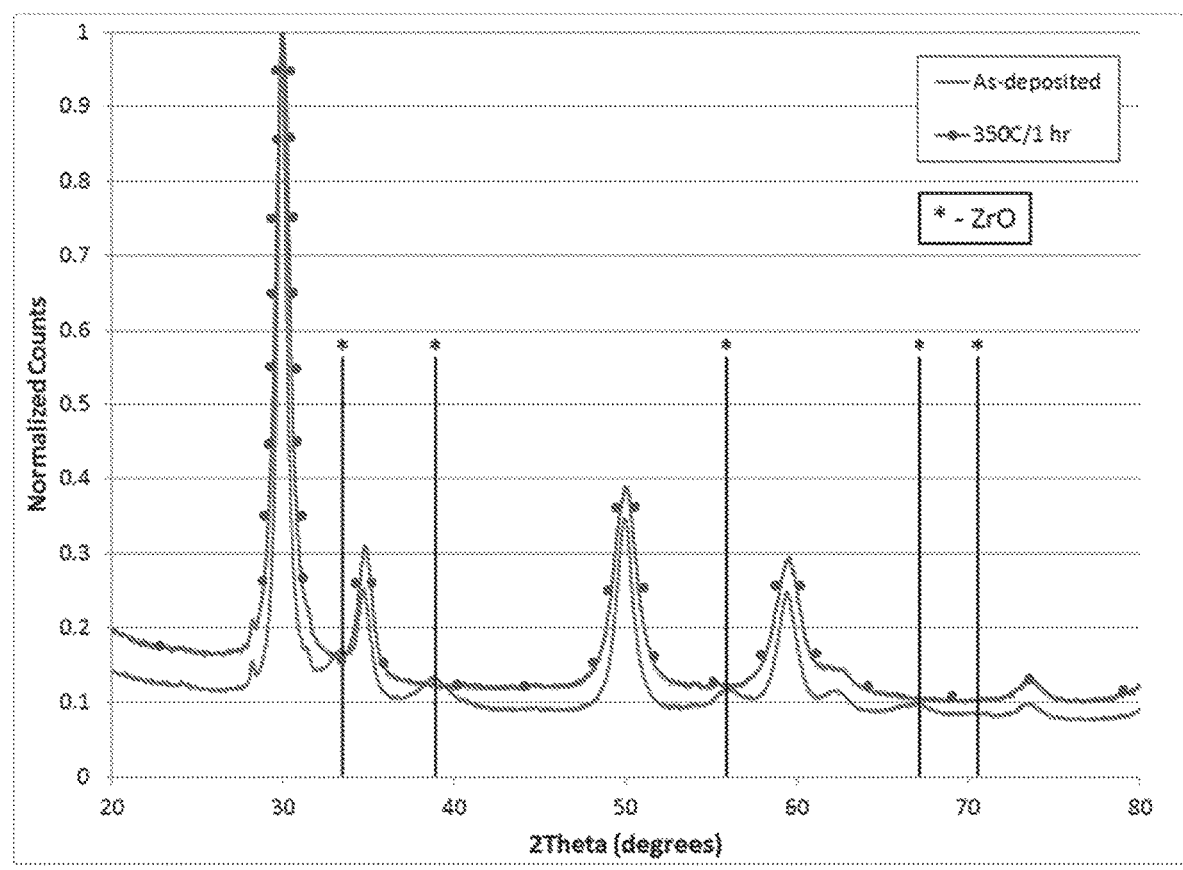
FIG. 1 is a graph depicting x-ray diffraction results of a PS-PVD $ZrO_2$ coating showing the presence of ZrO in the as-deposited state and its absence after a heat treatment in air.

The innovation is now described with reference to the drawings, wherein like reference numerals are used to refer to like elements throughout. In the following description, for purposes of explanation, numerous specific details are set forth in order to provide a thorough understanding of the subject innovation. It may be evident, however, that the innovation can be practiced without these specific details. In other instances, well-known structures and devices are shown in block diagram form in order to facilitate describing the innovation.

Thermal and environmental barrier layers for coatings for hot section turbine applications have been deposited using PS-PVD. A minority phase of a metastable oxide (ZrO) that is usually only found in the vapor state was observed when depositing $ZrO_2$ coatings. It was found that the coating volume of this metastable phase could be controlled by changing the processing parameters. Additional materials also displayed some of the same traits when deposited under certain conditions with PS-PVD, as HfO was observed while depositing $HfO_2$ and YbO was observed while depositing $Yb_2Si_2O_7$. It is noted that any oxide system is useable with the disclosed innovation. For example, any metal oxide can be used to create an oxide coating according to the innovation. Suitable examples include rare earth oxides, zirconium oxide, hafnium oxide, titanium oxide, or any combination of two or more thereof.

Temperature and oxidation sensitivity were tested and it was found that the phases dissipated upon heating above ~300° C. in oxygen-containing environments. Without being bound by theory, it is believed that the formation/deposition of these phases is linked to the rapid quenching of the vapor phase (which can be >7000 Kelvin) and the low pressure and low $PO_2$ in the gas stream. The monoxide form of these materials is stable as a vapor, but not as condensed phases. The high temperatures and fast deposition process of the PS-PVD system is what kinetically traps these nonequilibirium phases in the coating and allows them to exist at room temperature. The erosion properties $ZrO_2$ based coatings are important for high temperature gas turbine engines and it was found that these non-equilibrium materials have no negative impact, suggesting high durability.

In one aspect, the innovation is a coating that is at least partially conductive that can be deposited in a single step. The material has reduced oxygen content such that it exists in a metastable condition. Such coatings can be used for most any application, including applications for thermal and environmental barrier coatings. The coatings according to the innovation may also be used as sensors, electronic/ionic conduction membranes, gas separation membranes or other types of ionic conductors.

According to an aspect, the innovation provides a PS-PVD processes in which material is vaporized and condensed on the surface rapidly, resulting in a condensing of the metastable oxide vapor phase. In one embodiment, the method according to the innovation facilitates the deposition of a condensed monoxide phase (e.g., ZrO or HfO) from the oxide form or deposit it onto complex shapes like one can do with the PS-PVD process.

The phases formed via the process according to the innovation are not usually found outside of the vapor state. For example, using known processes, if $ZrO_2$ or $HfO_2$ (the thermodynamically stable phases) were reduced using a standard process reduction at high temperature, they oxidize from the dioxide to the metallic phase (e.g., $ZrO_2$ changes to Zr metal). The ZrO phase is stable as a vapor but not as a condensed phase. Use of the PS-PVD process according to the innovation facilitates the 'trapping' this phase in the deposited coating and allows it to remain in that state at room temperature.

According to an aspect of the innovation, the volume content of this metastable oxide and its microstructure can be varied depending on the processing parameters as well. Initial modeling has suggested that the ZrO material is conductive, and probe measurements have confirmed very low resistance or fully conductive coatings. However, because this material is nonequilibrium, it can be easily annealed out in the presence of oxygen at temperatures above 300° C.

The innovation is a coating and a method of making that coating that includes deposition under a set of conditions using the processing technique of Plasma Spray-Physical Vapor Deposition (PS-PVD). The coating that is being deposited has unique qualities that are not able to be achieved using other methods.

Analysis of coatings using X-ray diffraction indicates that the coatings are a mixture of a number of oxidation states. In one embodiment, the coatings of zirconia have been shown to contain $ZrO_2$, ZrO, and $Zr_3O$. The content of these phases are measureable (upwards of 30% in some cases), and have shown interesting characteristics. The coatings themselves have shown some electrical conductivity using point probes, and this is directly related to the presence of the metastable suboxide states (e.g., ZrO, $Zr_3O$). Similar phenomena have been observed in the deposition of other oxides (e.g., $Yb_2Si_2O_7$ and $HfO_2$) as homogenous compositions or as a composite with silicon.

X-ray diffraction database cards of YbO and ZrO have been observed to fit the diffraction patterns of coatings, and in the case of HfO, a pattern for the expected material was calculated and fits the XRD profile quite well.

In regards to the electrical conductivity, calculations of density of states have been done for ZrO that indicate that the material is conductive, while $ZrO_2$ is not. A simple point probe test has indicated that there is some conductivity in the PS-PVD generated material, even with ZrO content ranging from 10-30%.

According to an aspect of the innovation, the coatings deposited via the liquid or vapor phase are columnar, planar, or a combination of the two geometries. Thermal plasma is generated by the PS-PVD torch in a generally inert environment. Gases useful for generating thermal plasma include Ar, He, N, and H. In one embodiment, the thermal plasma is created in an environment that includes Ar and He gas.

Feedstock is injected into the system and heated to temperatures high enough to melt or vaporize the feedstock (e.g., the metal or ceramic material). The resulting material is deposited on the surface of a substrate via the liquid or vapor state and forms a coating. In one embodiment, the torch is not moved. The processing of the feedstock is done at low oxygen partial pressure and the gases used to create the plasma are inert so as not to oxidize the feedstock. The gas shrouding, in addition to the fast deposition from the high temperature plasma, results in an environment with low oxygen partial pressure (e.g., less than about 10 torr) which allows for the condensation of the vapor state. The resultant coatings contain the metastable reduced oxide phase and will retain these properties unless they are heated in an oxygen containing environment.

In one embodiment, the feedstock may be a solid (e.g., a powder), a liquid (e.g., a slurry or a suspension), or a gas. In one embodiment, the feedstock may comprise a metal oxide (e.g., $ZrO_2$, $HfO_2$, $TiO_2$, $Yb_2O_3$) or a combination of metal oxides. In one embodiment, the feedstock may comprise a rare earth oxide (e.g., cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb) and yttrium (Y)) or a combination of rare earth metal oxides. In one embodiment, the feedstock may comprise $ZrO_2$, $HfO_2$, $TiO_2$, $Yb_2O_3$, $Y_2O_3$, or a combination of two or more thereof.

In one embodiment, an oxide material may be formed from a feedstock. As described above, the thermal plasma generated by the PS-PVD torch may be used to heat a feedstock comprising or containing a metal oxide. The feedstock material is heated via the thermal plasma to the point of melting or vaporization. The low chamber pressure and low oxygen content of the plasma gases results in a low oxygen partial pressure within the plasma plume. A coating can be made via condensation or solidification from the vapor or liquid state or the material may be cooled and collected in a powder form via spraying into a catch-can or any other means for collecting sprayed material.

Prior PS-PVD processes/systems include a torch that is swept across the substrate or part for deposition and a small amount of oxygen is bled into the background. According to the innovation, the torch is static and no oxygen is bled into the background during the deposition. This results in a very low oxygen partial pressure in the core of the plasma and at the substrate surface. The rapid deposition of material on the substrate in this environment allows for the metastable oxide to be trapped in the coating or as kinetically trapped as a condensed phase. If the torch was swept across the substrate or part, the oxygen partial pressure in the background of the chamber is substantially higher than the core of the plasma, which allows for the metastable oxide to absorb oxygen from the chamber environment, even at pressures as low as 0.75 torr.

In one embodiment, the substrate or part may be most any substrate or part suitable for use with a coating according to the innovation. Suitable substrates/devices include porous and non-porous metals and ceramics, turbine engine components, SiC/SiC semiconductors, etc.

EXAMPLE

Zirconia was deposited on an alumina substrate. This substrate was inert and stable and should not change with heat treating. A coating was applied using PS-PVD according to the innovation and the X-ray diffraction pattern showed that there was a measurable amount (16-18%) of ZrO phase that was contained in the bulk of the deposited material. The sample was then heat treated to 350° C. in a thermogravimetric balance with flowing oxygen. There was a significant rise in weight in roughly the first 10 minutes of heating, and then the weight gain abruptly stopped. X-ray diffraction indicated that no ZrO phase remained in the sample after the heat treatment, and any electrical conductivity dissipated with the ZrO phase. Subsequent heat treatments to higher temperatures (700° C.) show no additional change in weight or composition as indicated by X-ray diffraction. Similar tests in air furnaces confirm the dissipation of the ZrO phase. When samples were heated in an inert environment, the ZrO phase persists. The phase has been shown to remain after heating in inert environments up to 700° C., but it is likely that in the absence of oxygen, the phase may persist up to significantly higher temperatures.

Figure 2:
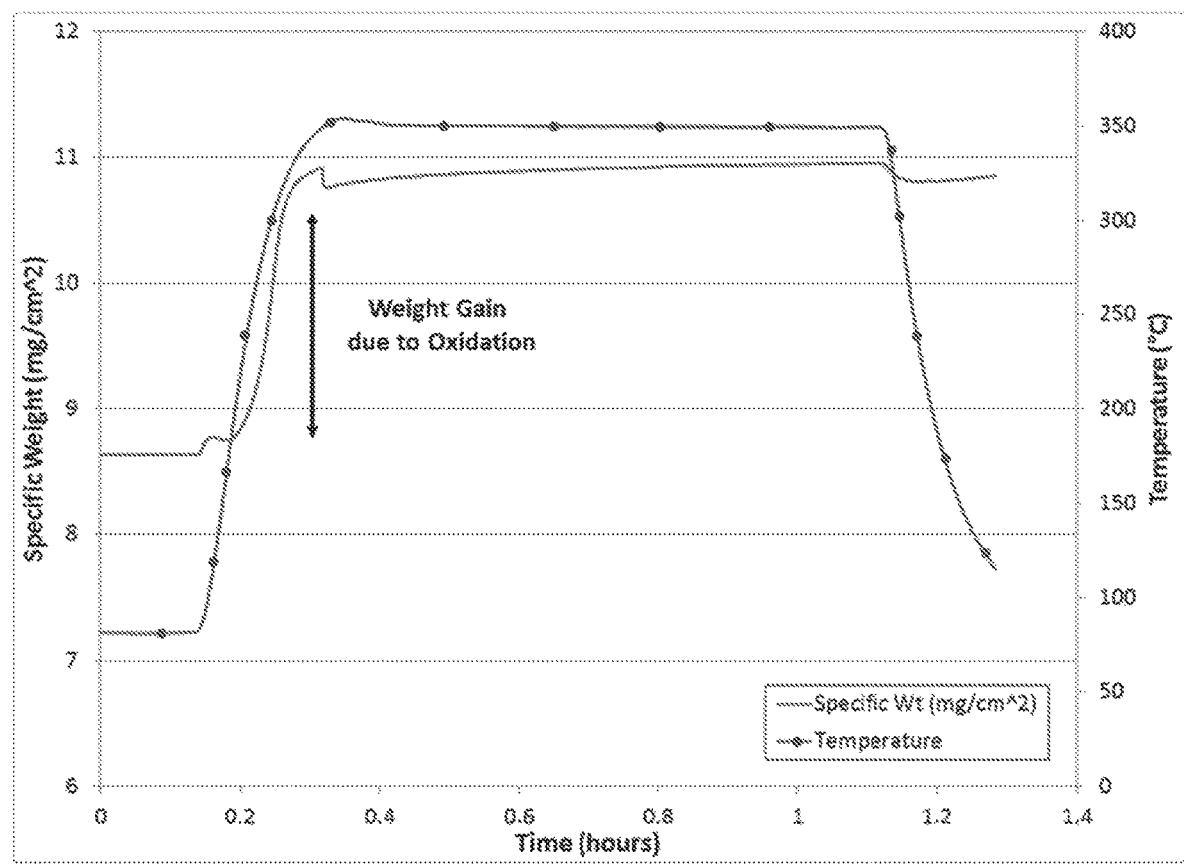
FIG. 2 is graph depicting the results of thermogravimetric analysis of $ZrO_2$ coating.

An unexpected phase was detected via X-ray diffraction (XRD) in YSZ ($Zr_{0.92}Y_{0.08}O_{2-\delta}$) coatings deposited using Plasma Spray-Physical Vapor deposition (PS-PVD). PS-PVD is a processing technique that involves a rapid quench from a vapor to form coatings. During the quench from temperatures in excess of 6000° C., non-equilibrium states can be trapped in the deposited material. In this instance, the XRD results (FIG. 1) showed an unexpected phase in the coatings. Although the tetragonal or monoclinic phases of YSZ were expected, the crystal structure also contained a second cubic phase with a smaller unit cell. Because the phase was formed under oxygen-poor conditions, it was expected that this phase was ZrO; the smaller unit cell closely matched the crystal structure of ZrO. The domains were on the order of 15-20 nm, suggesting that the coatings were poorly ordered which supported the theory of a rapid quench from the vapor, and a trapped non-equilibrium phase. Upon heating in a thermogravimetric analysis (TGA) balance in flowing oxygen at 300° C., the coating rapidly gained weight (FIG. 2) XRD of the coating after the exposure indicated the ZrO phase was gone, but the remaining phases were unchanged. It was also noted that when a significant amount of the metastable phase was present, the coating material was electrically conductive, with conductivity much greater than that of insulating $ZrO_2$. XRD results did not indicate the presence of a metallic Zr phase, suggesting that the metastable phase was the source of the increased conduction.

Figure 3:
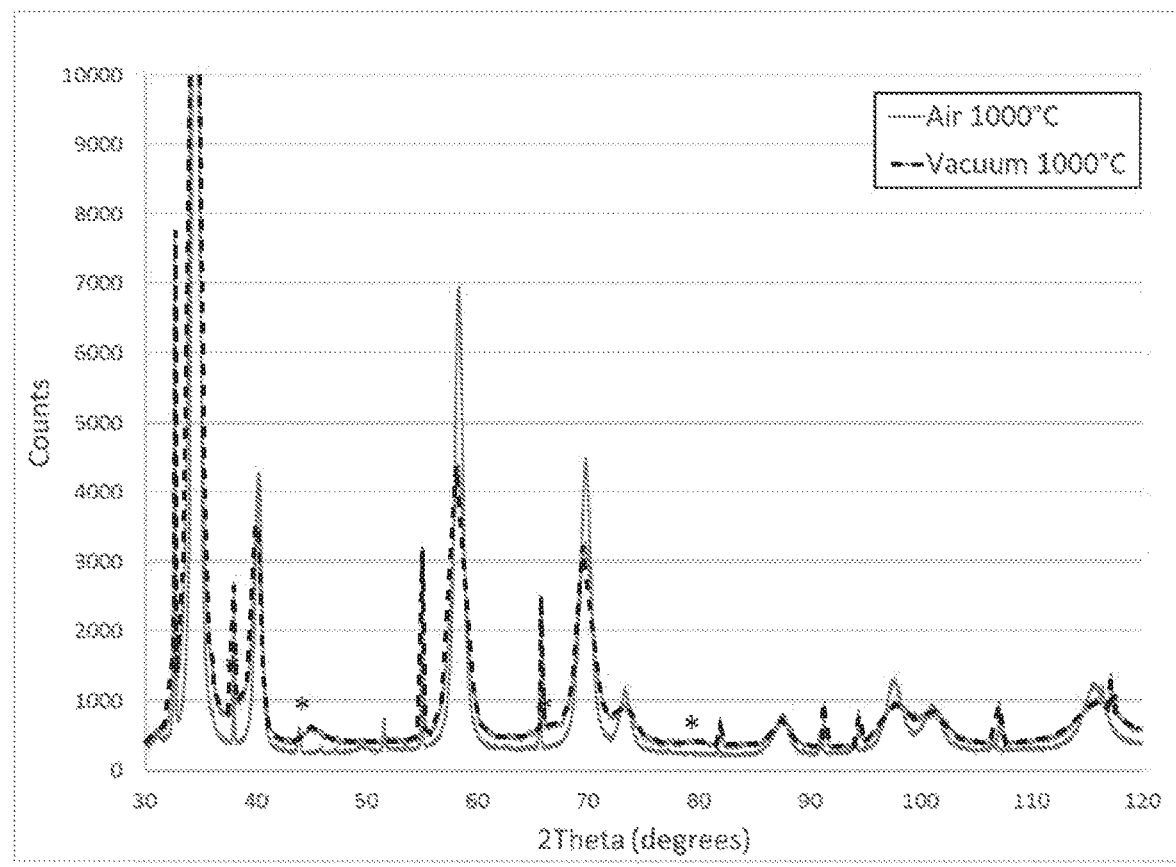
FIG. 3 is a graph depicting x-ray diffraction results of PS-PVD coatings on alumina substrates at roughly 1000° C. in air and in a vacuum environment

FIG. 3 is a graph depicting two X-ray diffraction measurements performed on PS-PVD coatings on alumina substrates at roughly 1000° C. in air and in a vacuum environment. The "ZrO" phase (noted by *) was shown to persist even up to 1000° C. in a low oxygen-containing environment.

Figure 4:
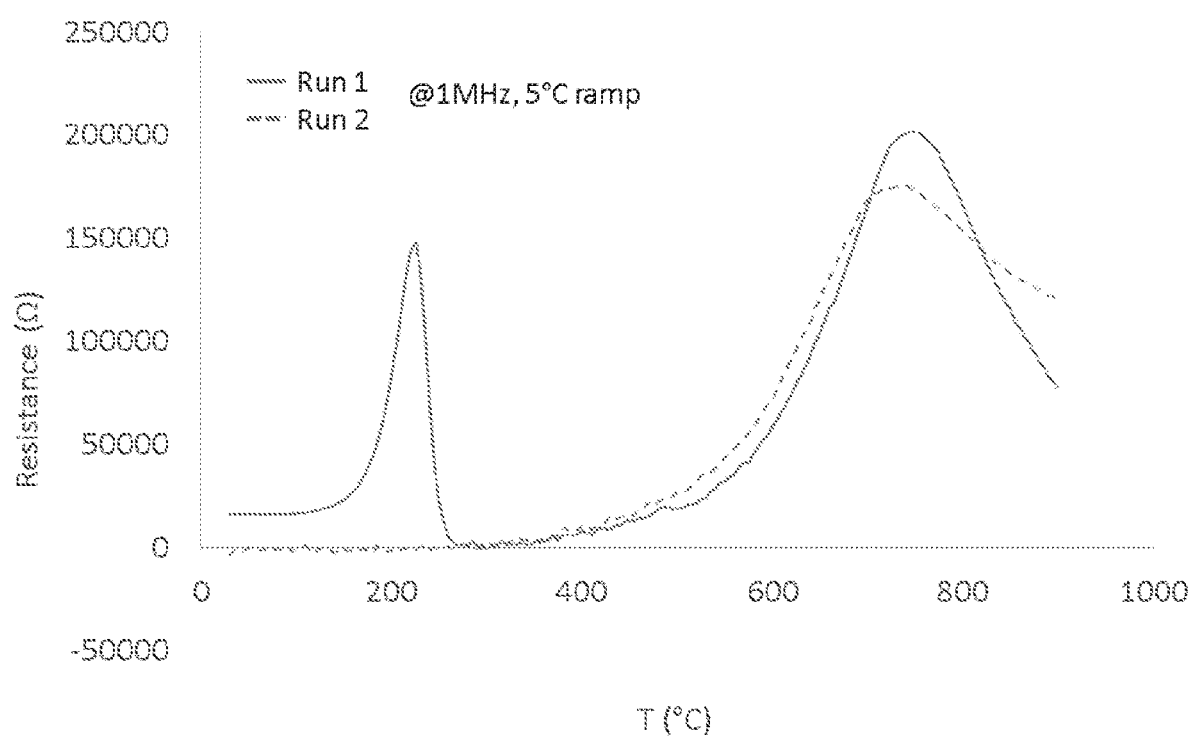
FIG. 4 is a graph depicting resistance measurements on a ZrO-containing coating according to an embodiment of the innovation on $Al_2O_3$ as a function of temperature (5° C. ramp rate up) in air.

FIG. 4 is graph depicting resistance measurements on a ZrO-containing coating on $Al_2O_3$ as a function of temperature (5° C. ramp rate up) in air. The Run 1 curve depicts the initial measurement on an as-deposited coating, which indicates nonzero conductivity at room temperature and rising until roughly 200° C., coinciding with the annealing of the "ZrO" phase. The Run 2 curve is the same coating after cooling from Run 1. In this case, there is no room temperature conductivity since the resistance is unmeasurable in this case (showing here as a negative value).

What has been described above includes examples of the innovation. It is, of course, not possible to describe every conceivable combination of components or methodologies for purposes of describing the subject innovation, but one of ordinary skill in the art may recognize that many further combinations and permutations of the innovation are possible. Accordingly, the innovation is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. An oxide coating comprising a condensate of a metastable suboxide vapor phase at room temperature, wherein the coating is deposited by plasma spray-physical vapor deposition (PS-PVD), to provide a thermal or environmental barrier layer, wherein the coating, having the metastable suboxide vapor phase, has greater electrical conductivity than the coating after dissipation of the metastable suboxide vapor phase via oxidization at room temperature.

2. The oxide coating of claim 1, wherein the metastable suboxide is a metastable oxide of at least one metal oxide.

3. The oxide coating of claim 2, wherein the at least one metal oxide is a rare earth oxide.

4. The oxide coating of claim 2, wherein the metastable suboxide is selected from ZrO, HfO, TiO, YbO, YO, or a combination of two or more thereof.

5. The oxide coating of claim 1, wherein the oxide coating is a part of a sensor.

6. The oxide coating of claim 1, wherein the oxide coating has a microstructure that is columnar, planar, or a combination of the two geometries.

* * * * *